(12) United States Patent
So et al.

(10) Patent No.: US 7,387,964 B2
(45) Date of Patent: Jun. 17, 2008

(54) COPPER POLISHING CLEANING SOLUTION

(75) Inventors: Joseph K. So, Newark, DE (US);
Terence M. Thomas, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 368 days.

(21) Appl. No.: 10/454,877

(22) Filed: Jun. 5, 2003

(65) Prior Publication Data
US 2003/0207778 A1    Nov. 6, 2003

Related U.S. Application Data

(60) Division of application No. 10/050,422, filed on Jan. 16, 2002, now abandoned, which is a continuation-in-part of application No. 10/006,491, filed on Dec. 7, 2001, now abandoned.

(51) Int. Cl.
*H01L 21/02* (2006.01)
*C11D 7/32* (2006.01)

(52) U.S. Cl. ............................ 438/692; 134/1.2; 134/3; 510/175; 510/490

(58) Field of Classification Search ................ 510/175, 510/176, 178, 245, 255, 258, 263, 264, 266, 510/477, 488, 504; 530/329, 331; 438/692
See application file for complete search history.

(56) References Cited

U.S. PATENT DOCUMENTS

| | | | |
|---|---|---|---|
| 6,194,366 B1 * | 2/2001 | Naghshineh et al. | 510/175 |
| 6,344,432 B1 * | 2/2002 | Wojtczak et al. | 510/175 |
| 6,492,308 B1 * | 12/2002 | Naghshineh et al. | 510/175 |
| 6,524,376 B2 * | 2/2003 | Aoki et al. | 106/14.42 |
| 6,561,883 B1 * | 5/2003 | Kondo et al. | 451/63 |
| 6,749,488 B2 * | 6/2004 | Pasqualoni et al. | 451/41 |
| 2001/0030315 A1 | 10/2001 | Aoki et al. | |
| 2001/0054706 A1* | 12/2001 | Levert et al. | 252/79.1 |
| 2003/0083214 A1* | 5/2003 | Kakizawa et al. | 510/175 |
| 2003/0136055 A1* | 7/2003 | Li et al. | 51/298 |

FOREIGN PATENT DOCUMENTS

| WO | WO 00/04633 A1 | | 7/2000 |
|---|---|---|---|
| WO | WO01/71789 | * | 9/2001 |
| WO | WO 01/71789 A1 | | 9/2001 |

* cited by examiner

*Primary Examiner*—Gregory R Del Cotto
(74) *Attorney, Agent, or Firm*—Blake T. Biederman (57) ABSTRACT

A cleaning solution for removing copper complex residues from the surface of polishing pads and wafer substrates includes an amine pH-adjusting agent, which can be a unidentate or bidentate amine compound or a quartnary ammonium hydroxide compound or an amine including an alcohol group. The cleaning solution also includes an amino acid complexing agent and an inhibitor. In a preferred embodiment, the cleaning solution has a basic pH.

10 Claims, 5 Drawing Sheets

ABS VS WAVELENGTH

Cu-BTA COMPLEX COMPOUND SPECTROPHOTOMETER

FIG. 1

Cu-BTA COMPLEX COMPOUND SPECTROPHOTOMETER

FIG. 2

BREAK DOWN OF Cu-BTA COMPLEX BOND

FIG. 3

SURFACE ANALYSIS GRAPH OF FREQUENCY VS. TIME
FOR ETHANOLAMINE STATIC ETCH ON COPPER

FIG. 4

SURFACE ANALYSIS DATA OF BTA COATED COPPER
EXPOSED TO ETHANOLAMINE

FIG. 5

CLEANING SOLUTION CITRIC + BTA + ETHANOLAMINE AT pH 10

UV SPECTROPHOTOMETER OF COPPER PEAK

COPPER POLISHING CLEANING SOLUTION

CROSS REFERENCE TO RELATED APPLICATION

This application is a division of application Ser. No. 10/050,422 filed on Jan. 16, 2002, now abandoned which is a continuation-in-part of application Ser. No. 10/006,491, filed Dec. 7, 2001 now abandoned.

FIELD OF THE INVENTION

The invention relates generally to cleaning a fluid compositions and to methods of their use and, more particularly, to a cleaning solution for removing copper polishing residues from polishing pads and wafer substrates.

BACKGROUND

Silicon wafers are widely used as substrates on which multilevel integrated circuits are fabricated. Integrated circuits on a semiconductor wafer are typically manufactured with insulating layers, semiconductive layers, such as polysilicon, and conductive metals substrate layers, such as tungsten, aluminum, copper and platinum. The dielectric materials can be a dielectric, such as, silica including thermally grown $SiO_2$ and chemical vapor deposited $SiO_2$ using tetraethylorthosilane gas (TEOS). Further, advanced integrated circuits often employ low K dielectric materials.

In circuit fabrication, a series of deposition and etch steps is required to form a multi-level pattern on semiconductor wafer. A non-planar surface is created during these manufacturing processes, which can cause focusing problems for photolithography equipment. Poor focusing during lithographic alignment and registration results in low yield and decreased device performance.

A polishing method known as chemical-mechanical-polishing or planarization (CMP) is often used to polish a non-planar wafer during circuit fabrication. CMP processes can be used to planarize insulating layers, such as dielectric material, conductive metals and semiconductive layers by utilizing different polishing slurry and polish pad configurations. For example, CMP processes are used in multi-layer interconnection structures having overlying aluminum alloy layers to flatten the interlayer dielectric films. Also, CMP is required to form tungsten plugs and inlayed of interconnection structures. For higher speed integrated circuits, copper lines with low resistance are used in damascene structures. Due to the difficulty and high cost associated with dry etching copper alloys, trenches or damascene structures are dry etched into dielectric films and then filled with barrier layer followed by copper seed and electroplating of copper. Copper CMP is use to remove excess material above the inlaid trench.

Slurries used in copper CMP typically include an abrasive, an oxidizing agent, a complexing agent or ligand, a corrosion inhibitor, such as benzotriazole (BTA) and other compounds that act as protective film or act as surfactant. For slurries with a high concentration of BTA, a copper-BTA compound (Cu-BTA) is formed as chemical reaction by-product. Both abrasive-free and reactive liquid slurries used in copper CMP can generate insoluble residues during polishing, such as Cu-BTA complex compounds and other BTA-Cu-organic polymer complexes. At high copper removal rates or high copper dissolution rate, the copper ion concentration exceeds maximum solubility ($K_{sp}$). With a high concentration of available BTA, Cu(I)-BTA compounds precipitate from solution, and at high concentration, coagulate into a surface residue having the consistency of chewing gum. When a high concentration of polymer ligand is available, a Cu(II)-polymer complex can precipitate and coagulate with Cu-BTA to form an amorphous mixture or chain-terminated structure.

During polishing, the insoluble Cu-BTA residues stick to the surface of the pad and accumulate to the point of eventually filling the grooves in the polish pad. The accumulation of insoluble residue in the pad grooves and micro-pores disturbs the normal slurry flow pattern. Since the slurry flow pattern is especially disturbed in areas where the wafer contacts the polish pad, the residue adversely affects polishing uniformity. Also, the copper removal rate decreases as the residue builds up during polishing.

To combat the deleterious effects of the insoluble residues, manufacturers have attempted to mechanically remove the residues from the wafer surface by frictional contact with a polishing pad. As the residue film is removed, however, just as during copper polishing, the copper complex accumulates on the polishing pad and fills grooves in the pad surface. De-ionized water (DI-water) is normally used during pad conditioning to help lubricate the pad and to remove debris from the pad. A high-pressure DI-water spray is used to speed up the cleaning process in CMP machines equipped with a pressure sprayer. Due to insolubility of slurry by-products, however, DI-water is largely ineffective at cleaning the pads and even a high pressure DI water spray is ineffective in removing the sticky BTA-Cu-polymer complex.

Although, conventional diamond grid disks are widely used to remove debris from polishing pads, the disks only condition the surface of the pad and cannot remove the residue within the polish pad grooves. Also, brush conditioners simply disturb the residue within the grooves and are largely unable to condition the pad surface and remove the residue. Using conventional cleaners in combination with a condition brush can be effective at reducing the residue on the polishing pad, but this process requires long condition times, which reduces the overall throughput of the polisher. Also, due to the slow dissolution kinetics of Cu-BTA complex residue in conventional cleaners, the condition brushes become contaminated during the conditioning process. Further, even in-situ conditioning during polishing with a diamond conditioner disk does not efficiently remove the insoluble residues within the pad groove. Accordingly, a need existed for a cleaning solution that can effectively remove complex insoluble copper residues from wafer and polishing pad surfaces.

BRIEF SUMMARY

The present invention addresses the cleaning problem associated with copper polishing by providing a cleaning solution that breaks down Cu-BTA complex bonds and prevents re-deposition of copper. The cleaning solution also minimizes excess copper etching and corrosion during polishing and post CMP cleaning. In a preferred embodiment, the cleaning solution includes a complexing agent and an azole inhibitor, where the complexing agent dissolves copper residue from a metal surface and forms copper ions in solution. The complexing agent maintains the copper ions in solution and substantially prevents the copper ions from redepositing on the metal surface.

DETAILED DESCRIPTION OF THE PREFERRED EMBODIMENTS

In accordance with the present invention, a cleaning solution is provided for cleaning substrates and polishing pads after completion of a metal polishing process. The substrates can be any microelectronic substrate, such as silicon, germanium, gallium arsinide, indium phosphate, and the like. The substrates support integrated circuit devices that are typically fabricated in multiple overlying layers. The integrated circuits can include several device levels, where copper-containing conductors electrically interconnect each device level and copper alloys. The integrated circuit device levels can also include barrier metals and via interconnect structures residing within insulating layers that vertically separate each device level. The substrate surface to be polished can include any of these metal structures in addition to insulating and dielectric materials.

At various stages during device fabrication, the substrates are subjected to a polishing process to planarize a given device level. The polishing process can be carried out with a conventional CMP apparatus, such as a wheel or belt type polisher, in which the polishing pad contacts the substrate surface in the presence of a polishing liquid. The polishing liquid can be an abrasive polishing slurry or a reactive polishing liquid. As will subsequently be described, the cleaning solution of the invention is applied to the substrates and polishing pad after processing the substrates in a CMP apparatus or other polishing device.

In one embodiment, the cleaning solution of the invention includes a complexing agent, which can be a unidentate alkyl amine, a bidentate alkyl amine, an amino acid, a quartnary ammonium hydroxide and a hydroxy amine compound.

In a preferred embodiment, the complexing agent can be a compound that binds to copper and exhibits a stability constant (β) of preferably at least about 5 and, more preferably at least about 15. Compounds having suitable binding constants with copper include organic acids, such as carboxylic acids, unidentate, bidentate, and tridentate amines, including acid amines, amino acids, and quartnary ammonium hydroxides.

Examples of unidentate amines include, ethanolamine, diethanolamine, methylamine, ethylamine, diethylamine, triethylamine, triethanolamine, catechol, gluconic acid, and the like.

The preferred bidentate amines can be expressed by the general formula (1):

(1)

where R is selected from the group consisting of alkyl, alkoxy, and aryl, and where x is at least 1 and y satisfies the expression 2x+4, and z is 2.

Examples of bidentate amines and alkly diamine include ethylenediamine, diethylenetriamine, n-propylethylenediamine, and the like.

Examples of tridentate amines include, triethylenetetramine, ethylene triamine pentaacetic acid, diethylene triamine pentaacetic acid, and triethylene triamine pentaacetic acid, and the like.

Examples of organic acids include citric acid, malonic acid, imidolic acid, asportic acid, oxalic acid, gluconic acid, and the like.

Examples of quartnary ammonium hydroxide compounds include, tetramethylammonium hydroxide, and other alky ammonium compounds.

Examples of hydroxy amine compounds include ethanolamine and the like.

In a preferred embodiment, the solution also includes a compound having a dipole ion structure. Preferred dipole complexing agents include the amino acids, such as glycine, lysine, serine, valine, alanine, and the like. In a most preferred embodiment the dipole complexing agent is glycine.

The forgoing complexing agents also impart a basic pH to the cleaning solution. In a preferred embodiment, the cleaning solution has a basic pH. In a more preferred embodiment, the cleaning solution has a pH of at least about 10 and, in a most preferred embodiment, a pH of at least about 10.5.

In another embodiment, rather than a basic complexing agent, the cleaning solution includes an organic acid complexing agent, such as citric acid, tartaric acid, acetic acid, and the like. Where an acidic complexing agent is used, the cleaning solution also includes a pH-adjusting agent, such as one of the amine compounds described above.

The cleaning solution of the invention also includes an inhibitor, such as BTA and the like. As explained in more detail below, during cleaning of the Cu-BTA complex residue, at some point the copper metal is free of residue and an uncoated copper surface is exposed to the cleaning solution. To prevent corrosion of the copper surface, a small amount of inhibitor, such as BTA and the like, is added to the cleaning solution to inhibit the attack on the copper by other chemicals in the cleaning solution. Preferably, the amount of inhibitor is very small, for example, about 100 ppm to about 1000 ppm.

In addition to an inhibitor, the cleaning solution of the invention can also include a surfactant, such as a detergent and the like. The surfactant enables the complexing agents to more completely wet the surface of the residue. By wetting the surface of the residue, the surfactant improves the reaction kinetics by enabling an increased concentration of complexing agent on the surface of the residue. The surfactant also reduces the static etching of the copper surface by coating the surface of the copper with a protective layer. Examples of surfactants include available under the trade names "Triton-45" and "Tamol-731" manufactured by Rohm and Haas and available from Rodel, Inc. (Newark, Del.).

Additionally, the cleaning solution can also include an abrasive. In a preferred embodiment, an abrasive containing colloidal silica known under the trade name "Klebosol" is added to the cleaning solution. The colloidal silica is preferably used in combination with a stabilizer, such as ammonium hydroxide or potassium hydroxide, or the like. In another embodiment other abrasive particles, such as metal oxides, alumina, and the like can also be used.

Further, where the cleaning solution is formulated with an amine complexing agent, a pH adjusting compound can also be included to maintain the pH of the cleaning solution in a desired pH range. Preferably, the amine complexing agent will also act as a buffer to increase the concentration of OH⁻ radicals in solution. It is preferred that an amine cleaning solution of the invention have a pH of at least about 10. Where the amine complexing agent does not produce sufficient hydroxyl groups, a pH-adjusting compound is added. For example, tetramethylammoniumhydroxide (TMAH), potassium hydroxide (KOH) or ethanolamine can be added to maintain a pH of about 10 or higher. In a more preferred embodiment, the cleaning solution has a pH of about 9 to about 12 and, in a most preferred embodiment about 10.5 to about 11.9.

In accordance with the invention, a sufficient amount of pH adjusting compound is added to insure that the pH will remain high even where the cleaning solution is heavily diluted with water prior to use. Many existing polishing systems automatically dilute cleaning agents with water at the time the cleaning solution is applied to a surface, such as a wafer or a polishing pad. For example, a dilution factor of about one to ten is common. Accordingly, the cleaning solution of the invention contains sufficient buffering agents to maintain an effectively high pH, even where a very large dilution ratio is used, such as one to five hundred or more.

As described above, during high removal rate polishing, saturation of copper ions on the polish pad occurs. When the concentration of copper ions exceeds the solubility constant ($K_{sp}$) and the copper ions react with BTA and polymer-based complexing agents, a copper residue forms on the substrate and polishing pad surfaces. The copper residue can be a Cu(I)-BTA complex, a Cu(II)-polymer complex or a ligand, or a multi-layer deposit composed of a combination of the foregoing copper residues. The copper residues stick together to form large sticky material on the surface of the pad, wafer, polisher heads and retaining rings. When the copper residues are not removed either during CMP or during cleaning and conditioning, or during a post CMP cleaning process, it will cause problems on subsequent process and impact the overall yield of the wafer.

Also as described above, the cleaning solution of the invention can be either a basic or an acidic solution. This is because it has been found that two distinct groups of chemicals are effective at breaking down the Cu-BTA residue. Both an acid group that generates sufficient $H^+$ in water and a basic group that generates sufficient $OH^-$ in water will rapidly dissolve the Cu-BTA complex.

When the cleaning solution has removed the Cu-BTA residue, the dissolved $Cu^+$ and $Cu^{++}$ ions in solution can react with BTA and re-plate the copper surface with the residue. The cleaning solution of the invention prevents the re-plating of the residue by maintaining the copper ions in solution. Accordingly, the complexing agent and any added pH adjusting agent function to both dissolve the residue from the surface of a wafer or polishing pad and to maintain copper ions in solution. By maintaining a high pH, the dissolution reaction can be completed very rapidly. For example, at a pH of about 10 or higher, a Cu-BTA complex can be dissolved in about 15 seconds.

In accordance with the invention, unidentate or bidentate amines with an $NH_2$ group at either end of the amine compound rapidly reacts to break the Cu-BTA bonds. While useful in the present invention, amines with only one $NH_2$ group at an end of a chain, such as found in ethanolamine, react more slowly than bidentate amine with an $NH_2$ group at both ends of the chain, such as found in ethylenediamine or diethylenetriamine.

Although not wishing to be bound by any particular theory, the inventors believe that the amine compound of the inventive cleaning solution reacts with copper polishing residues in a reactive polishing liquid or abrasive slurry. For example, copper CMP slurries with a high concentration of BTA and polymer based complexing agents are capable of removing electroplated copper from the surface of a damascene wafer at a high removal rate. The rate of dissolution of the Cu-BTA complex in an acidic solution will be governed by the following equilibrium expression (2):

$$[\text{Cu-BTA}]_s + H^+ \underset{(slow)}{\overset{(fast)}{\leftarrow}} \text{BTAH} + Cu^+ \qquad (2)$$

Due to the fact that majority of the Cu-BTA will be a precipitate, a simple rate equation, that describes solution kinetics cannot be used. The rate equation must include terms for the change in the wetted surface area with along with the change in reactant concentration. A simplified rate equation can be described as equation (3):

$$\text{Rate} = -d[\text{Cu-}BTA]/dt = k[H^+] \cdot (S_\theta \cdot \theta) \qquad (3)$$

Where k is the rate constant, $\theta$ is the percentage of surface coverage by $H^+$, $S_\theta$ is the surface area wetted by the cleaning solution. The magnitude of the surface area $S_\theta$ is a function of several parameters including the pH, the surface energy and the ionic strength. The percentage of surface coverage $\theta$ is dependent upon the pH. Under ideal conditions both $S_\theta$ and $\theta$ will be equal 1.

Thus any pH, ionic strength, surface energy combination that allows the surface to be totally wetted by the polishing or cleaning formulation should produce an $S_\theta = 1$ and allow maximum insoluble precipitate re-dissolution kinetics. Likewise, a sufficient concentration of $[H^+]$ ions to cause $\theta = 1$ will produce maximum insoluble precipitate re-dissolution kinetics. With these two requirements fulfilled, the dissolution rate equation (4) can be written as:

$$\text{Rate} = k'[H^+] \qquad (4)$$

where the rate constant k' is expressed as:

$$k' = k \cdot S_\theta \cdot \theta. \qquad (5)$$

As shown in equation (5), there is still a surface area term in the rate constant k', which can modulate the dissolution rate of the insoluble copper residue. As the surface to volume ratio changes, the rate can also change. Thus uniform film dissolution rates will be different than the dissolution rate of high aspect island deposits. Also any co-deposited materials within the BTA-Cu precipitate, for example, malic acid or polyacryllic acid complexes, may also modulate the dissolution rate as well as any co-deposited complexes of these materials with copper or other cations. The higher the concentration of hydrogen ions in solution, the faster the dissolution kinetics.

The dissolution of a copper-BTA complex in the presence of a complexing agent can be expressed as the reaction (6):

$$\text{Cu-BTA} + H^+ + L \underset{(slow)}{\overset{(very\ slow)}{\leftarrow}} \text{BTAH} + Cu(L)_x^{-y} \qquad (6)$$

where L is a complexing agent, BTAH is benzotriazole and x represents atomic ratio of the ligand L and y represents the electrical charge of the complex. To dissolve the copper residue, it is desirable to minimize the reverse reaction. Accordingly, the selection of a particular complexing agent will depend upon the stability constant of the ligand formed with copper ions and how it compares to the stability constant other copper ligands. The highest stability system will be formed once the system comes to equilibrium. Temperature, concentration, ionic strength and other properties of the solution can be modified to force the system to come to equilibrium more quickly, or to shift the equilibrium in the desired direction.

A similar condition exists for Cu-BTA in basic solution, where $H^+$ of equation (1) is replaced with $OH^-$ ions. In a basic solution using uni or bidentate amine, the primary chemical reaction to form OH⁻ can be expressed as either reactions (7) or (8) depending upon the nature of the amine compound:

$$NH_2-R+H_2O \rightarrow R-NH_3+OH^- \qquad (7)$$

$$NH_2-R-NH_2+H_2O \rightarrow NH_3-R-NH_3+OH^- \qquad (8)$$

Those skilled in the art will recognize that hydroxide anions can be also be formed in water by other compounds, such as KOH, NH₄OH, (CH₃)₄NOH, and the like.

In accordance with a preferred embodiment of the invention an amino acid functions as a complexing agent. The amino acid glycine is represented by the chemical formula (9)

$$^+NH_3CH_2COO^- \qquad (9)$$

where the (+) and (−) symbols indicated the dipole charge of the glycine. The dipole structure of glycine, and other amino acids, render amino acids as especially effective copper complexing agents. In addition to high reactivity with copper, amino acids are also noncarcinogenic compounds. A preferred copper polishing cleaning solution having an amino acid complexing agent includes the amino acid glycine having an undiluted concentration of about 12 wt. % to about 18 wt. %, tetramethyl ammonium hydroxide having an undiluted concentration of about 15 wt. % to about 20 wt. %, and BTA having an undiluted concentration of about 0.5 wt. % to about 1.5 wt. %. The amino acid cleaning solution preferably has a basic pH of at least about 10 and, more preferably, about 10 to about 12.

In accordance with the invention, the cleaning solutions can be used to clean wafers, polish pads, and carrier heads after a polishing operation is completed. Those skilled in the art will recognize that many possible applications of cleaning solution during a polishing process are possible. For example, the cleaning solution can be used as a rinse or buff cleaning step by flowing the cleaning solution flow directly onto the polish pad. Alternatively, to rapidly clean the beveled edge and backside of wafers, carrier retaining rings, and polishing pads, a cleaning solution with an abrasive component or surfactant is preferred. The abrasive provides enhanced mechanical force can assist in delivery of the cleaning solution between the wafer and carrier-retaining ring. For copper CMP polish, the cleaning step should take place after bulk copper removal and prior to removing any barrier material underneath the copper. For polishing systems having three platens that use a two-step polishing process, the cleaning solution can be applied after polishing is completed on the second platen and before the wafer is processed on the third platen. Where the cleaning solution is used with a polishing system having two platens, the cleaning solution can be applied before polishing wafers on the second platen.

EXAMPLES

Figure 1:
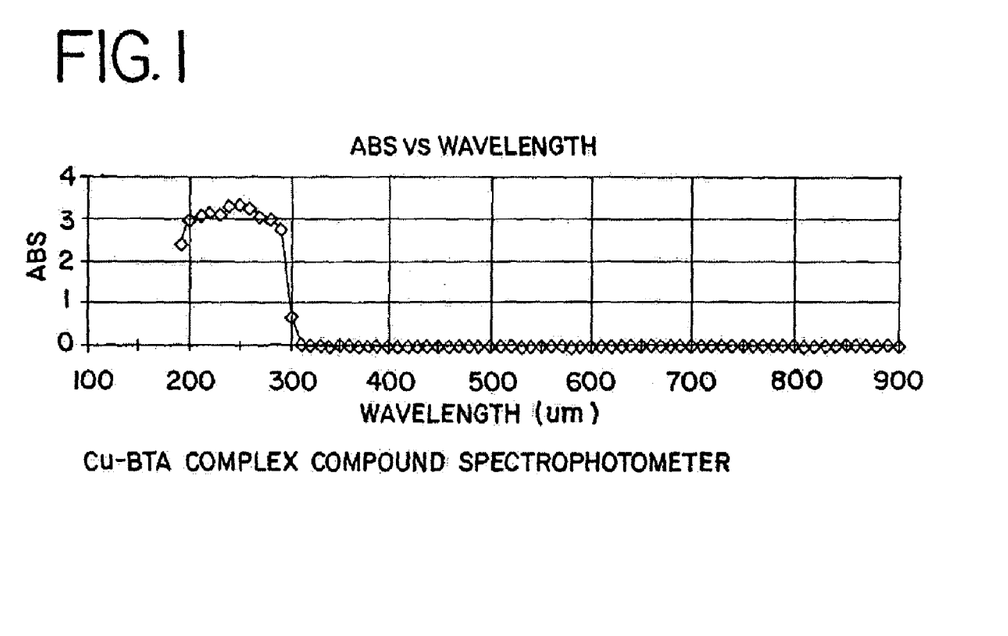
FIG. 1 is a spectrogram of wavelength versus absorbance of a Cu-BTA sample.

Chemical reactivity analysis was carried out to determine the extent to which several different chemical compounds reacted with a Cu-BTA complex produced by CMP of a copper film. The bonding characteristics of a Cu-BTA complex can be analyzed by UV spectrophotometry. To analyze the breakdown of the Cu-BTA complex, a Cu-BTA sample was prepared by adding about 5 grams of copper sulfate and about 5 grams of BTA in about 50 ml of DI water. The sample was then diluted with about 5 parts DI water to 1 part sample. The Cu-BTA complex was analyzed using a HACH DR/4000 Spectrophotometer. FIG. 1 is a spectrogram of wavelength versus absorbance of the Cu-BTA sample. An absorption peak in the 240-250 nm wavelength range on the spectrogram indicates the Cu-BTA complex.

Figure 2:
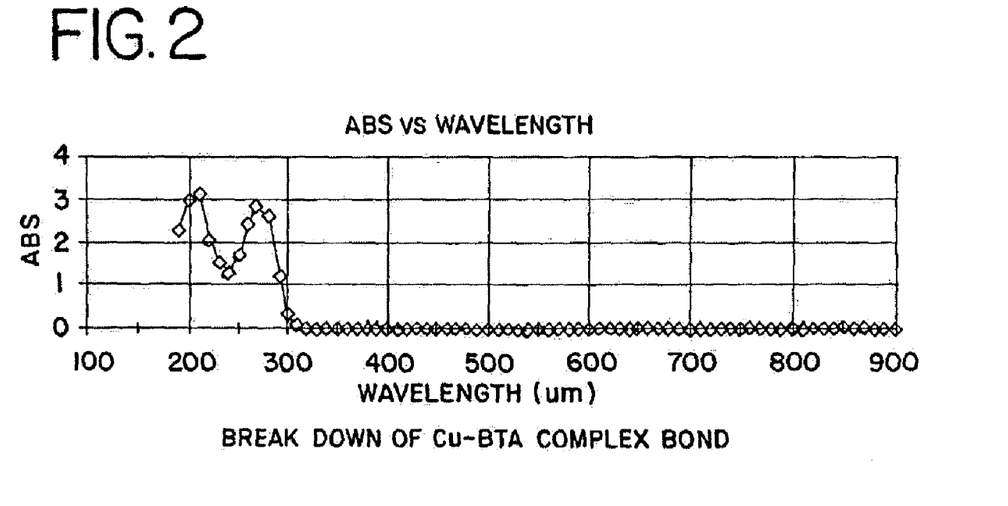
FIG. 2 is a spectrogram of wavelength versus absorbance for Cu-BTA sample after adding the potassium hydroxide.

To analyze the breakdown of the Cu-BTA complex in the sample, about 2 to 3 drops of potassium hydroxide (KOH 45 wt %) as added to the diluted sample. A spectroscopic analysis was then performed. FIG. 2 is a spectrogram of wavelength versus absorbance for Cu-BTA sample after adding the potassium hydroxide. The breakdown of the Cu-BTA complex compound is indicated by the reduction in absorbance, which appears as a valley near about 240 nm. The depth of the absorbance minima corresponds to concentration of Cu-BTA complex remaining in the sample.

Example I

Using the procedure described above, the each of the compounds shown below in Table I reacted with Cu-BTA complex and dissolved the Cu-BTA complex.

TABLE I

Compounds Tested for Reactivity with a Cu-BTA Complex

| Compound | pH |
|---|---|
| Nitric acid | 2 |
| Hydrochloric acid | 2 |
| CMP oxide slurry Klebosol 1508-50 (NH₄OH stabilizer) | 11 |
| CMP oxide slurry Klebosol 30N50 pH 9.9 (NH₄OH stabilizer) | |
| CMP oxide slurry Klebosol 1501-50 (KOH stabilizer) | |
| KOH | 11 |
| NH4OH | 11 |
| Tetramethylammonium hydroxide | 10 |
| Ammonium sulfide | |
| Ethanolamine | 10.5 |
| Ethylenediamine | 10 |
| Diethylenetriamine | 10 |
| N-propylethylenediamine | 10 |
| Triethylenetetramine | 10 |

The samples prepared in accordance with the procedure described above were timed to determine how the time period required for each cleaning solution to react with the Cu-BTA complex. Each of the cleaning solutions listed in Table I reacted to break up the Cu-BTA complex within about 30 seconds.

Example II

To evaluate the static etching of copper and the etching of a Cu-BTA complex, samples were prepared for surface analysis. To evaluate the static etching of copper, a substrate having a small amount of copper deposited on a substrate was placed in the analysis chamber of a surface analysis apparatus. The sample chamber was then flooded with DI water and the temperature of the sample chamber was brought to about 25° C. In the surface analysis instrument, the reaction of a chemical introduced to the sample chamber can be observed by monitoring a change in a frequency measurement output by the instrument. After taking an initial frequency measurement other chemicals can be added to the sample chamber to observe their effect on the copper sample.

Figure 3:
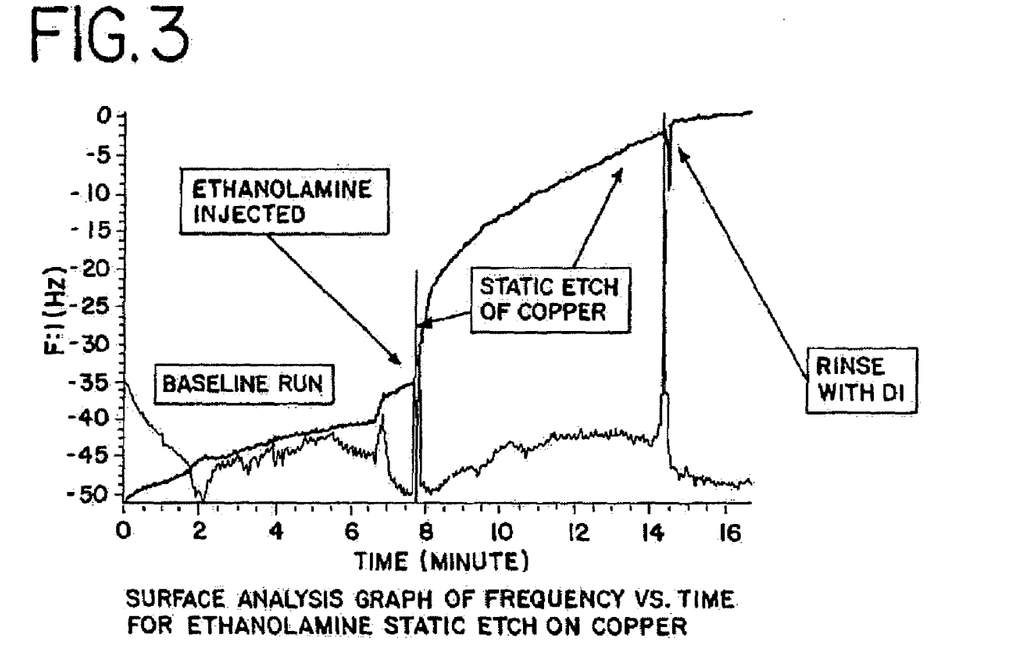
FIG. 3 is a plot illustrating a surface analysis graph for the static etching of copper by ethanolamine.

To determine the effect of ethanolamine, for example, after about 6 minutes and 50 seconds, about 5 drops of 99% ethanolamine were added to the DI water in the sample chamber. FIG. 3 illustrates a surface analysis graph for the static etching of copper by ethanolamine. In the graph, an increase in frequency vs. time correlates to a reduction in the weight of copper, whereas a decrease in frequency correlates with copper either sticking to the substrate surface or the re-deposition of copper on the substrate surface. At about 8 to 14 minutes after initial DI water stabilization, the surface analysis data graph shows a positive slope of increasing frequency indicating the static etching of copper on the substrate surface. After about 14 minutes, the sample chamber was flooded with DI water. The flattening of the curve indicates the cessation of copper etching.

Figure 4:
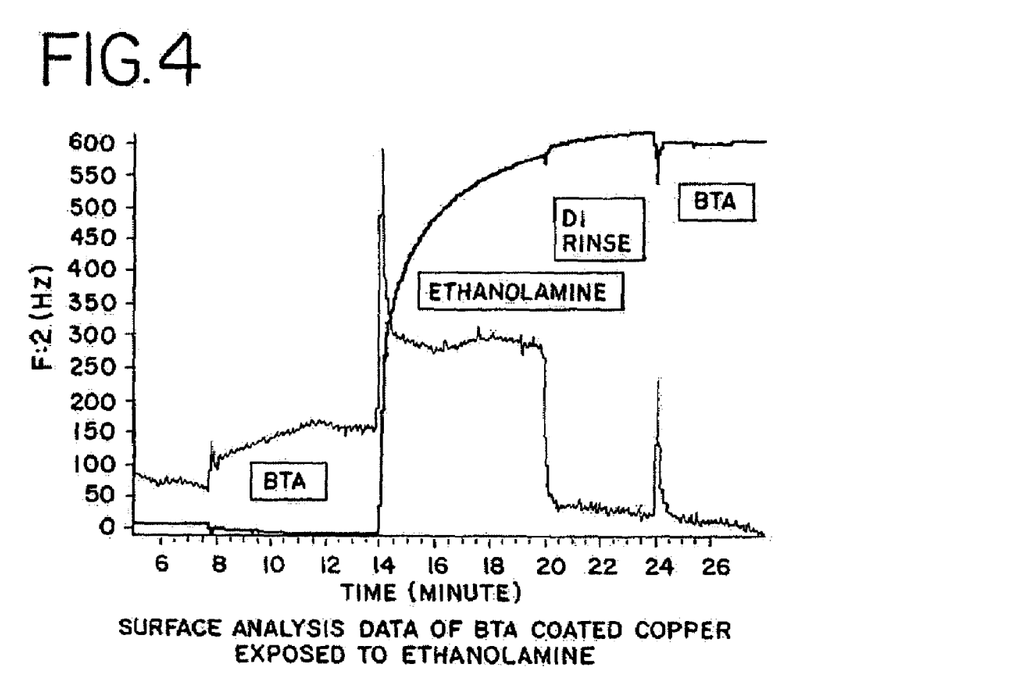
FIG. 4 is a plot illustrating a surface analysis graph for the static etching of BTA-coated copper after adding ethanolamine.

The effect of adding BTA on the static copper etch by ethanolamine was also examined. After carrying out the DI water initialization described above, about 5 drops of 1000 ppm BTA solution were added to the DI water about 8 minutes after initialization. After about 14 minutes, about 5 drops of 99% ethanolamine was added to the DI water. As shown in FIG. 4, after adding the ethanolamine, the OH⁻ groups in the ethanolamine solution react with the Cu-BTA to break the complex bonds. Again, the positive slope corresponding to an increase in the frequency output from the surface analysis instrument indicates that static etching of copper is in progress. After about 20 minutes, the sample chamber was flooded with DI water and a few drops of BTA were added at about 24 minutes. When BTA is reintroduced, it again protects the copper surface and the frequency change stabilizes.

The above procedure was carried out with all of the compounds listed in Table I. Based on the results of a substrate surface analysis, all chemical compounds listed in Table I will etch copper. With the exception of hydrochloric acid, the compounds listed in Table I are also capable of etching copper in solutions having an acidic pH. Although, hydrochloric acid initially statically etches copper, when the solution saturates with copper, copper chloride forms and is re-deposited on the copper surface.

Example III

Several cleaning fluid compositions according to the invention are listed below in Table II. These solutions are reactive with Cu-BTA complex residues, but do not corrode copper.

of cleaning solution 1 shows that without pH buffer, insufficient OH⁻ ions are produce by ethanolamine to break down the Cu-BTA complex. Accordingly, the pH buffer beneficially increases the concentration of amine in solution.

Example IV

Figure 6:
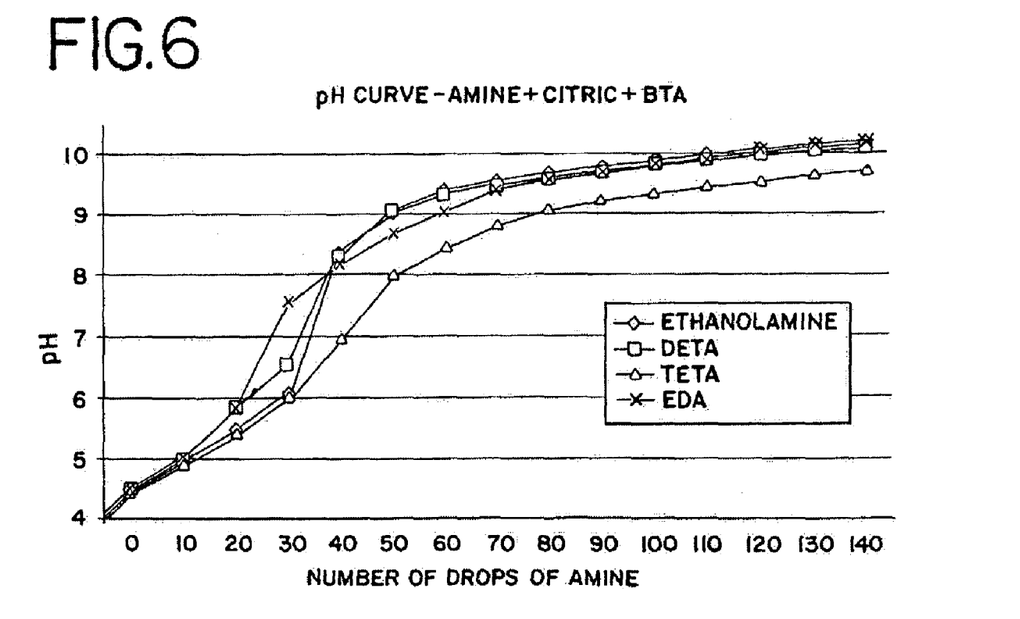
FIG. 6 is a plot illustrating the pH behavior of several solutions in accordance with the invention as the amount of the unidentate or bidentate amine compound is increased in the solution.

In a preferred embodiment of the invention, the copper cleaning solution has a basic pH. The pH buffering effect of several amines was determined by preparing a solution containing citric acid and BTA, then adding the particular amine drop wise to the solution while monitoring the pH of the solution. For this analysis, a stock solution was prepared having about 15 wt % citric acid and about 1 wt % BTA in about 50 ml DI water. After taking an initial pH measurement of the stock solution, pH monitoring commenced after adding 10 drops of amine. FIG. 6 illustrates the pH behavior of solutions 1, 2, 3, 5 from Table II as the amount of the unidentate or bidentate amine compound is increased in the solution. The buffering effect is observed for each amine after about 50 drops were added to the stock solution.

A preferred cleaning solution for copper CMP polisher who's process generates Cu-BTA insoluble deposits includes, DI water, about 0.192 wt % citric acid, about 0.15 wt % BTA in a solution having a pH of about 10 adjusted with ethylenediamine. Correspondingly, a preferred cleaning solution for use prior to barrier metal removal includes DI water, about 0.5 wt % citric acid, about 0.35 wt % BTA about 10 wt % colloidal silica (about 12 nm particles) in a solution having a pH of about 10 adjusted with triethylenetetramine.

Spectroscopic analysis was carried out on both the ethylenediamine solution (Solution A) and the triethylenetetramine solution (Solution B). When applied to a copper surface the color of the Solution A changed from a green to pink indicating that the ethylenediamine breaks Cu-BTA bonds and protonates BTA to [BTA]⁻. Correspondingly, the color of Solution B changed from green to blue indicating the reaction

TABLE II

| | Aqueous | Complexing agent | Surfactant | Inhibitor | PH adjuster | Final pH |
|---|---|---|---|---|---|---|
| Solution 1 | DIW | Citric acid | | BTA | Ethanolamine | 10 |
| Solution 2 | DIW | Tartaric acid | | BTA | Ethylenediamine | 10 |
| Solution 3 | DIW | Citric acid | | BTA | Diethylenetriamine | 10 |
| Solution 4 | DIW | Acetic acid | | BTA | N-propylethylenediamine | 10 |
| Solution 5 | DIW | Glycine | | BTA | Triethylenetetramine | 10 |
| Solution 6 | DIW | Citric acid | | BTA | Tetramethylammonium hydroxide | 10 |
| Solution 7 | DIW | Glycine | | BTA | Tetramethylammonium hydroxide | 10 |
| Solution 8 | DIW | Glycine | Triton 45 Polystep | BTA | Tetramethylammonium hydroxide | 11 |

The preferred cleaning fluid compositions include a complexing agent, pH buffer, a surface inhibitor, and a pH adjusted which can be one of several different amine compounds. Water-soluble uni or bidentate amines, with NH₂ groups at both ends of their carbon chain, and tetramethylammonium hydroxide were tested using the procedure described in Example II. These cleaning solutions effectively breakdown a Cu-BTA complex while not statically etching or corroding the underlying copper surface.

Figure 5:
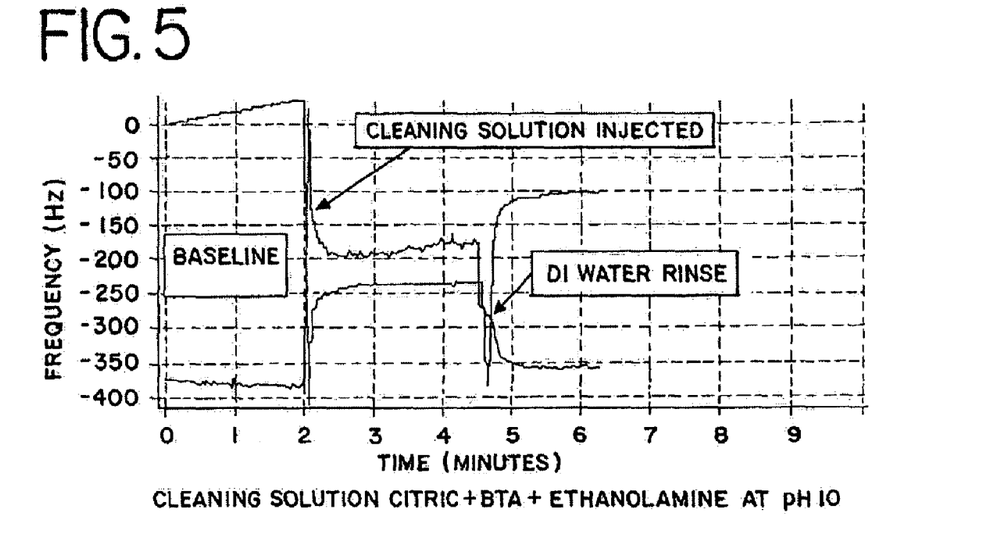
FIG. 5 is a plot illustrating a surface analysis graph for the static etching of copper by a cleaning solution in accordance with the invention.

After DI water stabilization, about 7 drops of exemplary cleaning 1 solution were added to the DI water. FIG. 5 illustrates a surface analysis graph for the static etching of copper by exemplary cleaning solution 1 from Table II. The pH affect of triethylenetetramine with the Cu-BTA complex to break Cu-BTA bonds and the complexing of ionized copper forming with tetramine ligands.

Example V

In accordance with the invention, copper ions are maintained in solution to avoid the redeposition of copper on the substrate. The ability of ethylenediamine (EDA) and diethlenetriamine (DETA) to solubilize copper ions was analyzed by preparing solutions Cu-BTA solutions containing about 0.3 grams of Cu-BTA complex in about 50 ml of DI water. In a first sample, about 1 ml of EDA was mixed into the solution by agitating the solution for about 10 seconds and a UV spectroscopic analysis was made with a Hach DR/4000 spectrophotometer. A second sample containing DETA was also prepared and analyzed in the same manner.

Figure 7:
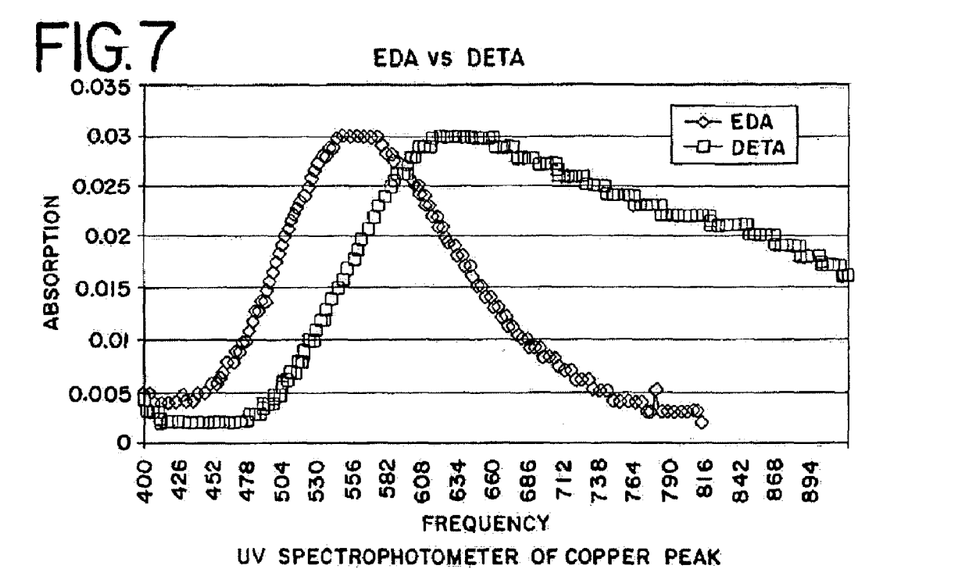
FIG. 7 is a spectrogram illustrating the presence of solubilized copper ions having two different oxidation states in solution.

The presence of solubilized copper ions having two different oxidation states in solution is shown in spectrogram of FIG. 7. In the spectrogram, separate copper peaks are shown at different frequencies in UV/VIS spectrum depending on the amine species used to form the cleaning solution. The different copper spectrum obtained with solutions of EDA and DETA indicate that two types of copper ions are present in solution. Cu(I) appears at about 630 m in an DETA solution, while Cu(II) appears at about 555 nm in an EDA solution. Solutions of Cu(II)-polymer complexes are colored as a result of weak absorption bands that are centered between about 400 nm and about 600 nm.

The ability of EDA and DETA to solubilize Cu(I) and Cu(II) ions was also examined by preparing stock solutions of copper (I) oxide ($Cu_2O$) and copper (II) oxide (CuO). Each solution was prepared by adding about 2 grams of copper oxide to about 50 ml of DI water. Then, about 5 drops of EDA were added to a copper (I) solution and a copper (II) solution and about 5 drops of DETA were added to a copper (I) solution and a copper (II) solution Each solution was analyzed by UV spectroscopic analysis.

Figure 8:
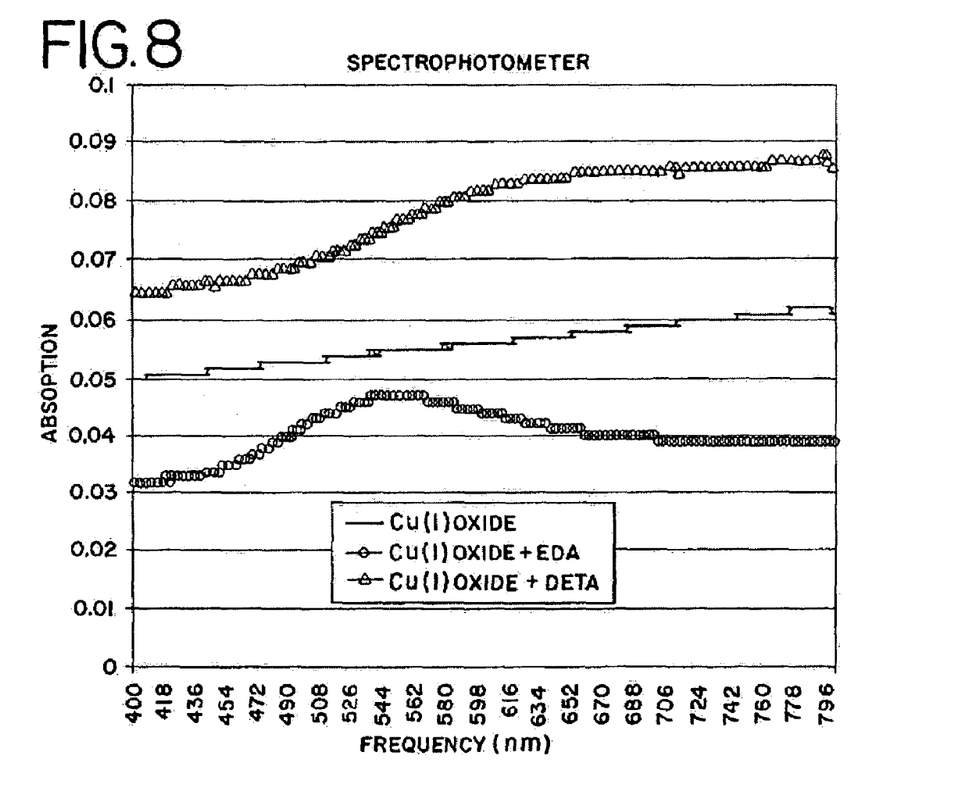
FIG. 8 is a spectrogram illustrating absorbance curves for copper (I) solutions.
Figure 9:
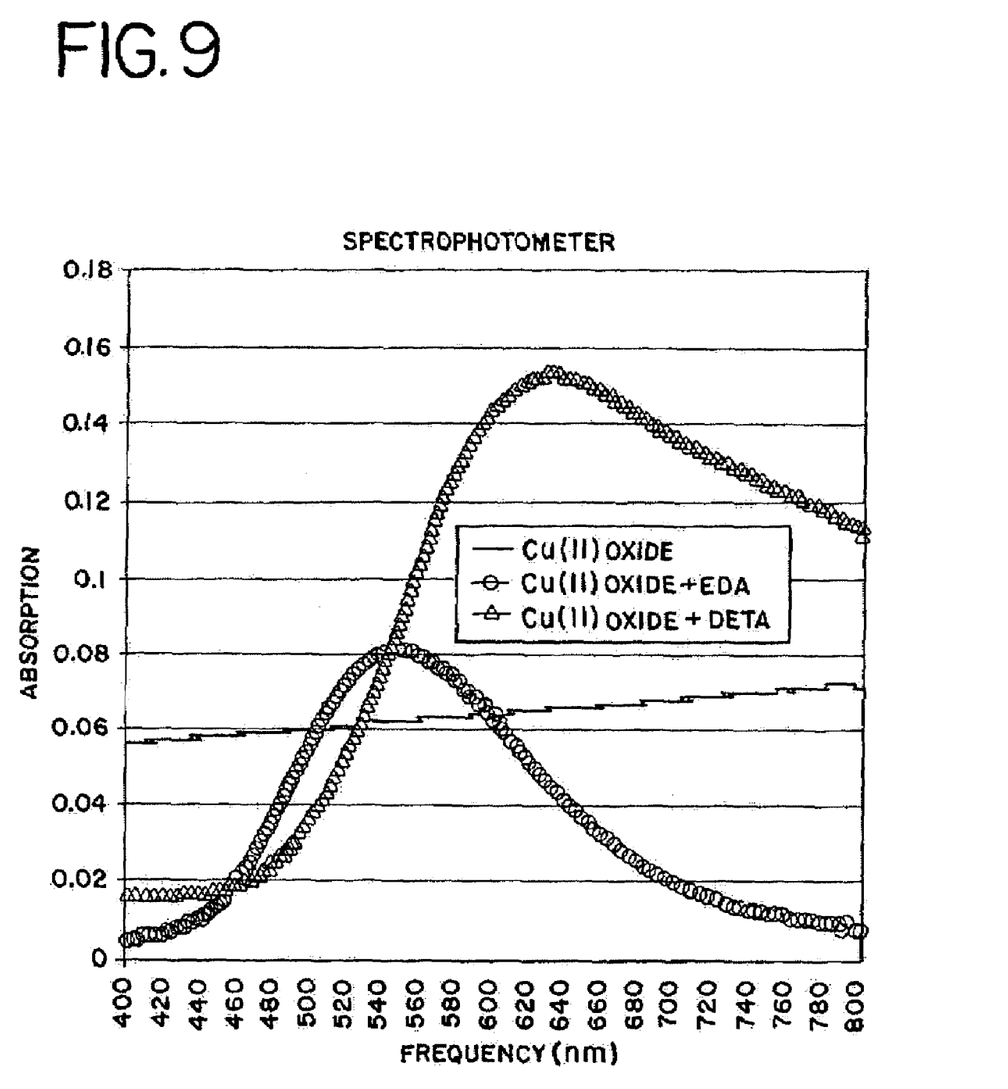
FIG. 9 is a spectrogram illustrating absorbance curves for copper (II) solutions.

The formation of copper (I) and copper (II) complexes in solution by reaction with ETA and DETA is shown by spectrographic analysis. FIG. 8 is a spectrogram showing absorbance curves for the copper (I) solutions and FIG. 9 is a spectrogram showing absorbance curves for the copper (II) solutions. Absorbance spectra for the EDA and DETA solutions are plotted against the spectra for copper (I) and copper (II) solutions without an amine additive. The spectrograms show that the Cu-BTA complex breakdown mechanism for uni and bidentate amines also applies to Cu(I) oxide and Cu(II) oxide. In solution with EDA and DETA, Cu(I) and Cu(II) oxides break down and release ionized Cu(I) or Cu(II) ions in solution as indicated by the absorption peak at about 550 nm for the Cu(I) ligand and at about 630 m for Cu(II) ligand.

Example VI

To determine the effectiveness of several cleaning solutions, the cleaning solutions were applied to wafers during post-CMP scrubbing. Wafer samples containing Cu-BTA residues were processed in an Ontrak scrubbing system (Lam Research Corporation, Fremont, Calif.). After scrubbing each wafer using a particular cleaning solution, each wafer was measured to determine the Cu-BTA residue remaining on the wafer surface. An Orbot metrology tool (Applied Materials Inc., Santa Clara, Calif.) was used to measure the residues present on the wafer surface. The residues were indicated as surface defects by the metrology tool. The results for five cleaning solutions and a DI water control sample are shown below in Table III.

TABLE III

Post CMP cleaning Cu-BTA Measued Defects

| Cleaning solution Defects | Total Cu-BTA Complex |
|---|---|
| DI water only | 1496 |
| Solution A: IPA, NH4OH pH 10 | 428 |
| Solution B: TMAH, H2O2, BTA at pH 10 | 81 |

TABLE III-continued

Post CMP cleaning Cu-BTA Measued Defects

| Cleaning solution Defects | Total Cu-BTA Complex |
|---|---|
| Solution C: Citric acid, BTA, Ethanolamine at pH 10 | 242 |
| Solution D: Citric acid, BTA, Diethylenetriamine at pH 10 | 76 |
| Solution E: Low Citric acid, BTA, Ethanolamine at pH 10 | 64 |

The post scubbing inspection showed that solutions C, D, and E according to the invention enabled the scrubber to remove substantially more Cu-BTA residue than DI water only and solution A Although the invention has been described and illustrated with reference to CMP processes and, specifically, for copper CMP, the invention is not limited to the illustrated embodiments. Those skilled in the art will recognize that modification and variations can be made without departing from the spirit and the scope of the invention. For example, in addition to applications in conjunction with conditioning apparatus used in CMP with a rotary or belt CMP tool, the invention can also be applied to a post CMP cleaning wet tank with temperature control and in conjunction with or in combination with a sonication method. Therefore, it is intended that this invention encompass all of variations and modification as fall within the scope of the claims and equivalents thereof.

The invention claimed is:

1. A method useful for removing copper(I)-BTA complex precipitate from substrates and polishing pads comprising the steps of:

polishing a microelectronic substrate in a manner wherein the concentration of copper ions exceeds the solubility constant ($K_{sp}$) and copper ions react with BTA to form the copper(I)-BTA complex precipitate on the microelectronic substrate;

introducing a copper polishing cleaning solution to dissolve the copper(I)-BTA complex precipitate and form copper(I) ions in the cleaning solution, the copper polishing cleaning solution having an amino acid complexing agent, the complexing agent having a dipole ion structure;

forming a complex between the copper ions and the complexing agent; and maintaining the copper ions in solution with the complexing agent to prevent the copper ions from redepositing on the microelectronic substrate.

2. The method of claim 1 wherein the complexing agent is selected from glycine, lysine, valine or alanine to maintain the copper ions in solution.

3. The method of claim 1 wherein the cleaning solution has a pH of at least 10.

4. The method of claim 1 wherein the complexing agent is glycine to maintain the copper ions in solution.

5. The method of claim 1 wherein the cleaning solution comprises a quartnary ammonium hydroxide compound for adjusting the pH of the cleaning solution.

6. A method useful for removing copper(I)-BTA complex precipitate from substrates and polishing pads comprising the steps of:

polishing a microelectronic substrate in a manner wherein the concentration of copper ions exceeds the solubility constant ($K_{sp}$) and copper ions react with BTA to form the copper(I)-BTA complex precipitate on the microelectronic substrate;

introducing a copper polishing cleaning solution to dissolve the copper(I)-BTA complex precipitate and form copper (I) ions in the cleaning solution, the copper polishing cleaning solution having an amino acid complexing agent, a basic pH and an azole inhibitor, the complexing agent having a dipole structure;

forming a complex between the copper ions and the complexing agent; and maintaining the copper ions in solution with the complexing agent to prevent the copper ions from redepositing on the microelectronic substrate.

7. The method of claim 6 wherein the complexing agent is selected from glycine, lysine, valine or alanine to maintain the copper ions in solution.

8. The method of claim 6 wherein the cleaning solution has a pH of 10.5 to 11.9.

9. The method of claim 6 wherein the complexing agent is glycine to maintain the copper ions in solution.

10. The method of claim 6 wherein the cleaning solution comprises a quartnary ammonium hydroxide compound for adjusting the pH of the cleaning solution.

* * * * *